United States Patent
Livolsi

[19]

[11] Patent Number: 6,020,767

[45] Date of Patent: Feb. 1, 2000

[54] CMOS CHIP TO CHIP SETTABLE INTERFACE RECEIVER CELL

[75] Inventor: Robert R. Livolsi, Shokan, N.Y.

[73] Assignee: International Business Machines Corporation, Armonk, N.Y.

[21] Appl. No.: 09/071,910

[22] Filed: May 4, 1998

[51] Int. Cl.[7] .................................................. H03K 5/22
[52] U.S. Cl. ............................................. 327/68; 327/206
[58] Field of Search ..................................... 327/205, 206, 327/68, 73, 74

[56] References Cited

U.S. PATENT DOCUMENTS

| | | | |
|---|---|---|---|
| 4,079,301 | 3/1978 | Johnson, III | 318/338 |
| 4,280,091 | 7/1981 | Hiltner | 323/315 |
| 4,463,271 | 7/1984 | Gill, Jr. | 327/74 |
| 4,535,294 | 8/1985 | Ericksen et al. | 328/150 |
| 4,677,315 | 6/1987 | Blauschild et al. | 327/73 |
| 5,122,680 | 6/1992 | Stakely et al. | 327/73 |
| 5,166,550 | 11/1992 | Matsubara et al. | 327/68 |
| 5,287,014 | 2/1994 | Kinoshita | 327/74 |
| 5,610,545 | 3/1997 | Jenskins et al. | 327/205 |
| 5,617,050 | 4/1997 | Jenskins et al. | 327/205 |
| 5,675,276 | 10/1997 | Goel | 327/205 |
| 5,736,826 | 4/1998 | Hrassky | 327/205 |

OTHER PUBLICATIONS

"Laser Fuse Programmable Input Level Receivers" IBM Technical Disclosure Bulletin, vol. 36, No. 6A, Jun. 1993, pp. 149–152.

"Switch Mode Power Supply For CRT Display" IBM Technical Disclosure Bulletin, vol. 29, No. 9, Feb. 1987, pp. 3921–3922.

"Transistor Rectifier Regulator" IBM Technical Disclosure Bulletin, Nov. 1979, pp. 2319–2320.

*Primary Examiner*—Timothy P. Callahan
*Assistant Examiner*—An T. Luu
*Attorney, Agent, or Firm*—Lynn L. Augspurger

[57] ABSTRACT

A receiver of signals on cross chip boundaries for coupling chips with different coupling requirements allows changing hysteresis settings with changeable inputs to the receiver for connections between chips of different technologies without the need for masking or making a new circuit. The chip hysteresis profile switches from one setting to another based on the input from control logic supplied by a driver output level (DOL) pin input. Thus the receiver for signals on cross chip boundaries on directly connected and for interposer connection situations where chips need to be interconnected allows customization of the hysteresis across the connection. The receiver for chip to chip transitions receives a control input from a device output level control signal. When DOL is in high state it sets for the intermediate hysteresis levels and when it is in the low state it sets for a normal hysteresis level. A receiver enable pin turns the receiver power OFF and sets the output pin at a known deterministic state. The input pin IN takes data from the off chip environment nets providing an input in accordance with the needs of a sending chip and processes the data through the circuit to the output pin. The input levels can be configured to receive the signal sent from a sending chip depending upon the state of the DOL pin.

11 Claims, 1 Drawing Sheet

CM OS CHIP TO CHIP SETTABLE INTERFACE RECEIVER CELL

FIELD OF THE INVENTION

This invention is related to CMOS circuits and particularly to a cell which is useful as a receiver of signals on cross chip boundaries on directly connected and interposer connected situations.

BACKGROUND OF THE INVENTION

Cells useful as a receiver of signals on cross chip boundaries normally have fixed hysteresis which impedes development. Complex endeavors such as those described in the article in IBM's TDB v36 n6A 06-93 p149–152, entitled "Laser Fuse Programmable Input Level Receivers" by authors M. K. Ciraula, C. M. Durham, and D. L. Jallice noted that VLSI chips require specific logic input levels that are characteristic of the system environment(s) in which they are to be used. Then two most common were CMOS (1.5V and 3.5V) and TTL (0.8V and 2.0V). They noted that when designing chips the interface circuits, known as on-chip receivers or OCRs, engineers must consider which set of logic input levels will be required in the system environment. When multiple system environments are expected with potentially differing logic input level requirements, the authors suggested designers must provide the option for different logic levels on the VLSI chip, stating that typically, these different levels are programmable using one or two processing mask level changes. However, this creates two problems: 1, multiple separate sets (or subsets) of processing masks are required, and 2, chips must be stockpiled in distinct formats. For discussion purposes, the two most common interface levels, TTL and CMOS were presented in this article. However, it should be noted that the concepts presented can be extended to most any interface level requirement. This article describes a means to provide input-level programming from CMOS to TTL or TTL to CMOS without the use of processing mask changes using laser fuses. Consequently, the resulting chip designs are more versatile for manufacturing and system designers, producing multiple input levels from a single processing mask set. Therefore, chip stockpiling can be done without regard to input-level requirements when on-chip receivers designed in CMOS technologies can be made to switch at various voltage levels by changing the ratio of input pull-up (P-FET) and pull-down (N-FET) devices. However, changing the hysteresis required added to the OCR circuitry to provide additional noise immunity, which is accomplished by adding feedback latches, Schmitt trigger circuits, hysteresis latches etc. This adds delay and complexity and cost to development.

Later IBM patented a "Precision Hysteresis Circuit" by B. L. Stakely and R. Wenda, with U.S. Pat. No. 5,122,680, for a CMOS circuit arrangement with precise balanced switch points. The circuit arrangement included a voltage-follower which forces a reference voltage across an on-chip reference resistor. The current which is generated is mirrored and is made to flow through a plurality of on-chip resistors. The mirrored current flowing through the plurality of resistors generates a plurality of proportional reference voltages. Two of the proportional reference voltages are used to set the switching threshold to one input of a comparator whose output is fed back to control a switch which selects one of the two voltages. Another one of the proportional reference voltages is coupled to another input of the comparator. The circuit arrangement forms a hysteresis circuit if positive and negative thresholds are chosen. Generating hysteresis on an integrated circuit chip generated a precise voltage across an on-chip resistance, and current mirroring provided a current (IREF) flowing in the on-chip resistance (R0) to flow in a plurality of ratioed independent resistive means. Then a fixed voltage is generated across a selected one of the ratioed independent resistive means and compared with a selected one of a plurality of switched voltages generated across selected ones of the ratioed independent resistance.

SUMMARY OF THE INVENTION

My invention provides cells useful as a receiver of signals on cross chip boundaries in situations like those addressed by the aforementioned TDB article but my receiver cell circuit allows changing hysteresis settings by changable inputs to the circuits to all connections between chips of different technologies without the need for masking or making a new circuit, but instead in accordance with the needs of a sending chip. In accordance with my invention a chip has a hysteresis profile which switches from one setting to another based on the input from control logic I/O driver output level (DOL) pin input, which is coupled to the receiver, and to the sender logic environment. Thus the cell is useful as a receiver of signals on cross chip boundaries on directly connected and interposer connection situations where chips need to be interconnected and allows customization of the hysteresis across the connection.

These and other improvements are set forth in the following detailed description. For a better understanding of the invention with advantages and features, refer to the description and to the drawings.

DETAILED DESCRIPTION OF THE INVENTION

Figure 1:
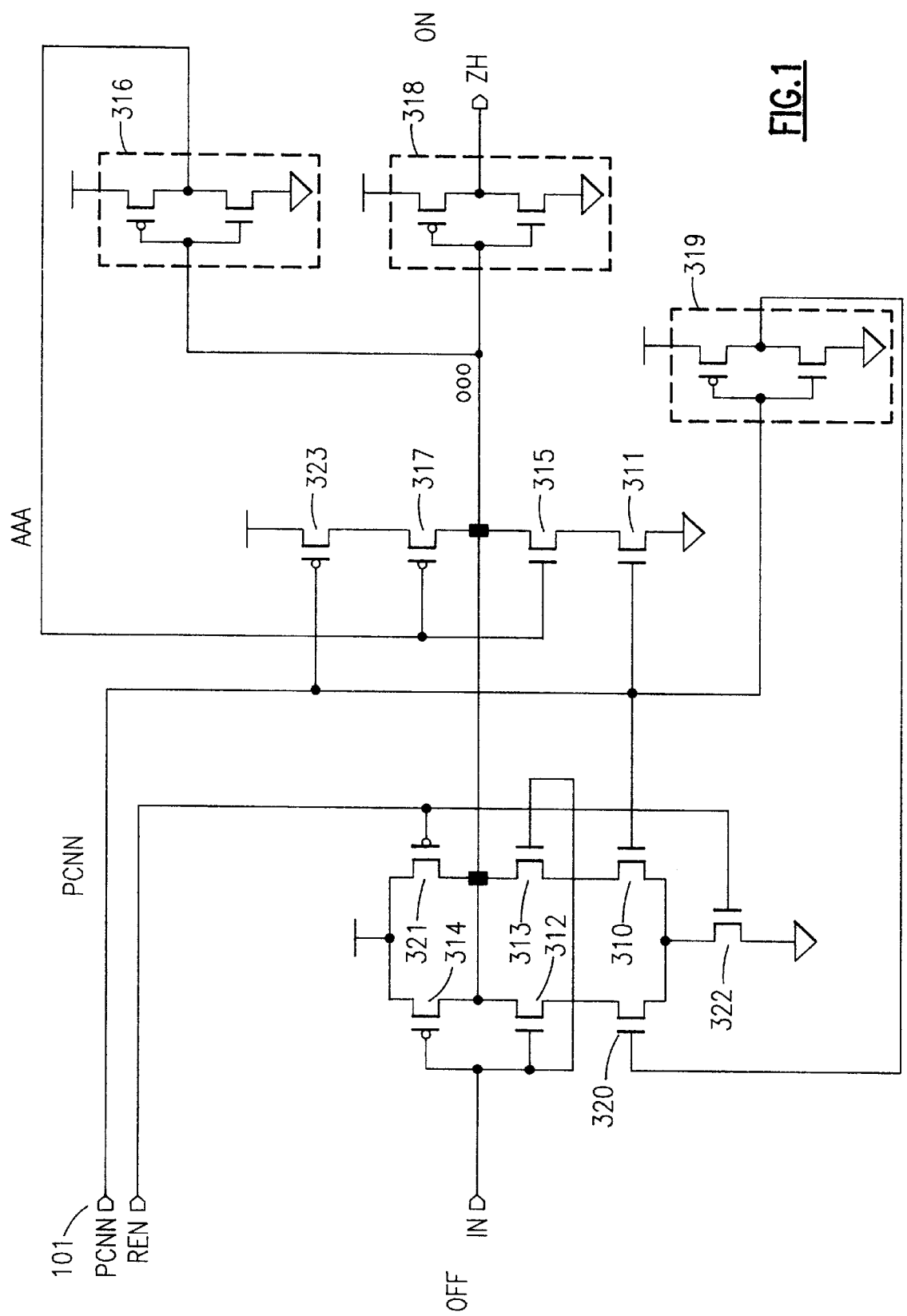
FIG. 1 shows schematically the preferred embodiment.

Turning now to my invention in greater detail, it will be seen from FIG. 1 which illustrates my preferred embodiment in which the receiver normally on a receiver chip or on interposer circuit chip on the substrate thereof represented by the substrate for the entire FIG. 1 has a hysteresis profile which switches based on the input of the DOL pin 101.

PCNN provides the input 101'(DOL pin) which comes off a control I/O logic block (not shown but supplying the input signal to the DOL pin from interface control settings), and the signal on DOL pin 101' provides the receiver control input. The same I/O control logic block would provide the input to a chip driver or to the receiver of the preferred embodiment. DOL__0 and DOL__1 are outputs of the I/O logic block. They represent a Boolean description of DOL and the driver enable.

Hence when DOL is a logical high level, DOL__0 is set high and DOL__1 is set low. And similarly, when DOL is a logical low level, DOL__0 is set low, while DOL__1 is set high. In the end, they represent in some way the DOL pin to the internal workings of the driver, and similarly, this receiver.

For the receiver of the preferred embodiment, when DOL is in high state it sets for the intermediate hysteresis levels and when it is in the low state it sets for a normal hysteresis level. The receiver enable pin REN turns the receiver power OFF and sets the output ZH at a known deterministic state. The input pin IN takes data from the off chip environment nets and processes the data through the circuit to the ZH pin.

The input levels can be configured to receive the signal sent from a sending chip depending upon the state of the DOL pin.

Depending on the state of 101' (branch from 101) input NFET 310 and 311 are either turned ON or OFF. When 101' is in a high state the NFETs 310, 311 are turned ON enabling an intermediate hysteresis path. With intermediate levels transitioning from a high to a low level transition NFETs 312 and 313 begin to turn OFF while voltage supply PFET 314 begins to turn ON creating a contention with control NFET 315. This interaction causes ooo data line out node to begin to rise at a specific crossover voltage at the input pad IN which is at the downgoing threshold. Node ooo rising along with the threshold level is inverted by inverter 316 to activate a holding control PFET 317 which holds node ooo at a fixed uplevel. Inverter 318 buffers the signal at node ooo to the output pin ZH. Note that when 101' is high the inverter 319 turns a disable NFET 320 off, to disable the normal hysteresis path.

When 101' is in a low state NFET 310 and NFET 311 are turned OFF while disable NFET 320 is turned ON and when the input IN pad transitions from an high to a low transition, the contention is between 314 and 312 causing node ooo to rise and buffer 318 to drive the signal to ZH (out).

Thus the dynamic characteristics of the receiver are changed to meet the needs of a circuit coupled to the ZH interface out pin. ZH interface pin is coupled to a second chip. A circuit such as the preferred embodiment exists on a sender chip and a receiver chip and can be used in interposer chip situations.

Receiver enable pin REN turns the receiver ON through switch PFET 321 OFF and switch NFET 322 ON respectively and the receiver is turned OFF when switch PFET 321 is ON and switch NFET 322 OFF. During normal mode of operation, pin 101' is low and turns control PFET 323 ON and input NFET 310 and input NFET 311 OFF and disable NFET 320 ON through interaction with a third inverter 319. Therefore on the input pin IN a normal to high transition occurs turning voltage supply PFET 314 OFF, transition NFET 312 ON, forming a contention with holding control PFET 317. As node ooo begins to fall interaction with the first inverter 316 causes holding control PFET 317 to turn OFF bringing node ooo to a stable low state. The second inverter 318 buffers node ooo to pin ZH.

While we have described my preferred embodiments of my invention, it will be understood that those skilled in the art, both now and in the future, may make various improvements and enhancements which fall within the scope of the claims which follow. These claims should be construed to maintain the proper protection for the invention first disclosed.

What is claimed is:

1. A CMOS receiver circuit cell of a receiving chip useful as a receiving circuit for receiving signals from a sending chip on cross chip boundaries for coupling chips which have different coupling requirements, comprising: a receiver circuit cell on said receiving chip having an control input line for receiving a control input from a device output level control signal from an environment coupled to said sending chip for receiving a device output level control signal (DOL) in said receiver circuit cell for chip to chip transitions, said control input from a device output level control signal (DOL) when DOL is in high state setting said receiver circuit for first hysteresis levels and when said device output level control signal (DOL) is in the low state said control input setting said receiver circuit for a second hysteresis level, said receiver circuit cell having a receiver enable pin for receiving a receiver enable signal to turn OFF power for said receiver circuit cell and to set the output of the receiver circuit cell at a predetermined deterministic state to override all prior hysteresis levels, said receiver circuit having an input pin for said control input line to take data from an off chip environment which provides said control input to the receiver circuit in accordance with the needs of said sending chip and to couple the external environment to said receiver circuit cell for processing of said data through the receiver circuit to a receiver circuit cell output, the state of said device output level control signal being configurable by control input level settings providing a capability of receiving a signal sent from said sending chip which depends upon the state of the DOL pin.

2. A CMOS receiver circuit cell of a receiving chip according to claim 1, wherein a change in the DOL control input levels changes the hysteresis of the receiver circuit cell receiving chip enabling connections between chips of different technologies.

3. A CMOS receiver circuit cell of a receiving chip according to claim 1, wherein said receiver circuit cell changes the hysteresis profile of the chip for which it provides its output and switches from one hysteresis setting to another based on the input from control logic supplied by a driver output level (DOL) pin input.

4. A CMOS receiver circuit cell of a receiving chip according to claim 3, wherein said receiver circuit output provides signals in response to a signal passing across cross chip boundaries from directly connected sending chips as well as from an interposer chip connection where chips need to be interconnected with customization of the hysteresis across the connection.

5. A CMOS receiver circuit cell of a receiving chip according to claim 1, wherein the DOL control input signal determines which set of characteristics of a receiver is selected to meet the needs of a circuit coupled to the output of said receiver circuit cell output.

6. A CMOS receiver circuit cell of a receiving chip according to claim 1, wherein depending upon the control input level signal state receiver circuit cell input NFETs are either turned ON or OFF, and when an input is a high state the input NFETs are turned ON enabling a first hysteresis path, while when said input levels transition from a high to a low level said input NFETs turn OFF while voltage to a supply PFET 314 begins to turn ON creating a contention with a control NFET 315 to cause a data line out node to begin to rise at a specific crossover voltage at the input to the receiver circuit which is at the downgoing threshold and when a data line out node rises along with the threshold level is inverted by a first inverter 316 to activate a holding control PFET 317 which holds the data line output node at a fixed uplevel.

7. A CMOS receiver circuit cell of a receiving chip according to claim 6, wherein a second inverter buffers the data line signal at the data line output node for the output pin.

8. A CMOS receiver circuit cell of a receiving chip according to claim 7, wherein is provided a third inverter to turn off and disable the normal hysteresis path.

9. A CMOS receiver circuit cell of a receiving chip according to claim 8, wherein when the input signal level is in a low state the input NFETS are turned OFF while disable NFET is turned ON and when the input IN pad transitions from a high to a low transition, a contention is formed between a voltage supply PFET and transition PFET causing the data line output node to rise and said buffer to drive the signal to the output.

10. A CMOS receiver circuit cell of a receiving chip according to claim 9, wherein the receiver has said receiver enable pin REN to turn the receiver ON through switch PFET 321 OFF and switch NFET 322 ON respectively and the receiver is turned OFF when switch PFET 321 is ON and switch NFET 322 OFF, wherein during normal mode of operation when the input signal level is low it turns a control PFET ON and an input NFET and input NFET OFF and disable NFET ON through interaction with said third inverter.

11. A CMOS receiver circuit cell of a receiving chip according to claim 10, wherein when on input a normal to high transition occurs it turns a voltage supply PFET OFF, a transition NFET ON, forming a contention with a holding control PFET, while as the data line output node begins to fall interaction with said first inverter causes the holding control PFET to turn OFF bringing the data line output node to a stable low state which is buffered by said second inverter to the output of the receiver circuit.

* * * * *